(12) United States Patent
Bakker et al.

(10) Patent No.: US 7,061,574 B2
(45) Date of Patent: Jun. 13, 2006

(54) LITHOGRAPHIC APPARATUS WITH CONTAMINATION SUPPRESSION, DEVICE MANUFACTURING METHOD, AND DEVICE MANUFACTURED THEREBY

(75) Inventors: Levinus Pieter Bakker, Helmond (NL); Vadim Yevgenyevich Banine, Helmond (NL); Vladimir Vitalevitch Ivanov, Moscow (RU); Konstantin Nikolaevitch Koshelev, Troitsk (RU); Vladimir Mihailovitch Krivtsun, Troitsk (RU)

(73) Assignee: ASML Netherlands B.V., Veldhoven (NL)

( * ) Notice: Subject to any disclaimer, the term of this patent is extended or adjusted under 35 U.S.C. 154(b) by 16 days.

(21) Appl. No.: 10/985,037

(22) Filed: Nov. 10, 2004

(65) Prior Publication Data

US 2005/0122491 A1    Jun. 9, 2005

(30) Foreign Application Priority Data

Nov. 11, 2003   (EP)   ................................ 030078552

(51) Int. Cl.
*G03B 27/52*    (2006.01)
*G03B 27/42*    (2006.01)

(52) U.S. Cl. .......................................... 355/30; 355/53
(58) Field of Classification Search .................. 355/30
See application file for complete search history.

(56) References Cited

U.S. PATENT DOCUMENTS

| | | | |
|---|---|---|---|
| 6,614,505 B1 * | 9/2003 | Koster et al. ................. | 355/30 |
| 2003/0053594 A1 | 3/2003 | Fornaciari et al. | |
| 2004/0099820 A1 * | 5/2004 | Bristol ..................... | 250/493.1 |
| 2004/0119394 A1 * | 6/2004 | Klebanoff et al. .......... | 313/356 |
| 2005/0016679 A1 * | 1/2005 | Ruzic et al. .............. | 156/345.5 |
| 2005/0139785 A1 * | 6/2005 | Banine et al. ........... | 250/492.2 |
| 2005/0140945 A1 * | 6/2005 | Banine et al. ................ | 355/30 |

FOREIGN PATENT DOCUMENTS

WO    WO/99/42904    8/1999

* cited by examiner

*Primary Examiner*—W. B. Perkey
*Assistant Examiner*—Vivian Nelson
(74) *Attorney, Agent, or Firm*—Pillsbury Winthrop Shaw Pittman LLP

(57) ABSTRACT

A lithographic projection apparatus is provided. The apparatus includes a radiation system for providing a beam of radiation, and a support for supporting a patterning device. The patterning device serves to pattern the beam of radiation according to a desired pattern. The apparatus also includes a substrate table for holding a substrate, a projection system for projecting the patterned beam of radiation onto a target portion of the substrate, and a particle supply unit for supplying getter particles into the beam of radiation in order to act as a getter for contamination particles in the beam of radiation. The getter particles have a diameter of at least about 1 nm.

26 Claims, 5 Drawing Sheets

LITHOGRAPHIC APPARATUS WITH CONTAMINATION SUPPRESSION, DEVICE MANUFACTURING METHOD, AND DEVICE MANUFACTURED THEREBY

CROSS-REFERENCE TO RELATED APPLICATIONS

This application claims the benefit of priority from European Patent Application No. 3078552.1, filed Nov. 11, 2003, the entire content of which is incorporated herein by reference.

FIELD

The present invention relates to a lithographic projection apparatus with contamination suppression, a device manufacturing method, and a device manufactured thereby.

BACKGROUND

The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include a mask, a programmable mirror array, and a programmable LCD array.

The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

One example of a programmable mirror array is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-adressable surface. An alternative embodiment of a programmable mirror array employs a matrix arrangement of tiny mirrors, each of which can be individually tilted about an axis by applying a suitable localized electric field, or by employing a piezoelectric actuator. Once again, the mirrors are matrix-addressable, such that addressed mirrors will reflect an incoming radiation beam in a different direction to unaddressed mirrors; in this manner, the reflected beam is patterned according to the addressing pattern of the matrix-adressable mirrors. The required matrix addressing can be performed using suitable electronics. In both of the situations described hereabove, the patterning device can include one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable, as required.

An example of a programmable LCD array is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machines. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction), while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, so that the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices, the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both of which are incorporated herein by reference.

In order to be able to image smaller features, it has been proposed to use extreme ultraviolet radiation (EUV) with wavelengths in the range of 5 to 20 nm, particularly 13.5 nm, or charged particle beams, e.g. ion beams and electron beams, as the exposure beam in a lithographic apparatus. These types of radiation require that the beam path in the apparatus be evacuated to avoid beam scatter and absorption. Because there is no known material suitable for making a refractive optical element for EUV, an EUV lithographic apparatus must use mirrors in the radiation (illumination) and projection systems. Even multilayer mirrors for EUV radiation have relatively low reflectivities and are highly susceptible to contamination, further reducing their reflectiveness and, hence, throughput of the apparatus. This imposes further requirements on the vacuum level to be maintained, and may necessitate hydrocarbon partial pressures be kept very low.

At the same time, plasma radiation sources and the resist are substantial sources of contaminants that should be kept out of the illumination and projection systems. A discharge plasma source, for example, uses a discharge to create a partially ionized plasma, which then collapses to yield a very hot plasma that radiates EUV. The plasma gas, which is often Xe, and debris from the source should be kept from entering the illumination system. At the other end of the apparatus, the radiation incident on the resist to expose it may cause emission of debris and by-products by outgassing. It is desirable to prevent both source and resist debris from reaching the illumination and projection systems.

EP-A-0 957 402 discloses a system for preventing resist debris entering the projection system. The system includes a simple tube, preferably conical, which surrounds the projection beam between the projection system enclosure and the substrate. A gas flow in the tube entrains resist debris to prevent it from entering the projection system enclosure.

International application WO-A-03/034153 describes a further improved device for trapping debris, such as may be emitted by a plasma source or from resist exposed to EUV radiation. This document describes a contaminant trap that includes a first set of plate members arranged parallel to the direction of propagation of the projection beam, and a second set of plate members that is arranged parallel to the direction of propagation. The first and second sets are spaced apart from another along an optical axis of the projection beam. There is a space between the first and second set of plate members. Flushing gas is supplied to that space to provide a high gas pressure to trap the contaminant particles. The two sets of plate members are designed so that leakage of the gas is minimized and that the gas pressure outside the trap is kept low. However, still, an amount of EUV is also absorbed by this gas with relatively high pressure.

SUMMARY

It is an aspect of the present invention to improve trapping of debris, especially the debris that is emitted by the plasma source that produces the EUV radiation.

This and other aspects may be achieved according to the invention in a lithographic apparatus that includes a radiation system for supplying a projection beam of radiation, and a support structure for supporting a patterning device. The patterning device serves to pattern the projection beam according to a desired pattern. The apparatus also includes a substrate table for holding a substrate, and a projection system for projecting the patterned beam onto a target portion of the substrate. The lithographic projection apparatus further includes a particle supply unit for supplying getter particles into the projection beam of radiation in order to act as a getter for contamination particles in the projection beam. The getter particles have a diameter of at least about 1 nm, and preferably less than about 1000 nm.

In an embodiment, a lithographic projection apparatus is provided. The apparatus includes a radiation system for providing a beam of radiation, and a support for supporting a patterning device. The patterning device serves to pattern the beam of radiation according to a desired pattern. The apparatus also includes a substrate table for holding a substrate, a projection system for projecting the patterned beam onto a target portion of the substrate, and a particle supply unit for supplying getter particles into the beam of radiation in order to act as a getter for contamination particles in the beam of radiation. The getter particles have a diameter of at least about 1 nm.

By letting the EUV projection beam of radiation and the debris pass a volume with such "nanoparticles", most of the EUV photons from the projection beam of radiation will pass, either having been transmitted through the particles, or traveling without colliding with a nanoparticle at all, whereas the nanoparticles will act as a getter for debris.

It is observed that where the term "nanoparticles" is used in this description, reference is made to particles with a diameter in the order of about 1–1000 nm. However, it will be understood by a person skilled in the art that the volume of the lithographic projection apparatus that is supplied with these nanoparticles may include other particles having a diameter outside this range. It may be difficult to produce particles within this range only.

The getter particles may be selected from a group that includes $Si_3N_4$, Si, $SiO_2$, $Al_2O_3$, C, Mo, Sn, Ru, Zr, Fe, Au, liquid $N_2$, liquid $CO_2$, liquid $H_2O$, SiC, Xe, and Ar. These materials, when produced in the form of nanoparticles, may have a reasonable transmission for EUV, e.g., with a wavelength of 13.5 nm.

In an embodiment, the particle supply unit includes a supersonic nozzle.

In a further embodiment, the lithographic projection apparatus is provided with a contamination trap. The particle supply unit is arranged to supply the getter particles in a space upstream from the contamination trap, relative to a direction of propagation of the projection beam of radiation.

In a further embodiment, the present invention provides a lithographic projection apparatus that includes a radiation system for providing a projection beam of radiation, and a support structure for supporting a patterning device. The patterning device serves to pattern the projection beam according to a desired pattern. The apparatus also includes a substrate table for holding a substrate, a projection system for projecting the patterned beam onto a target portion of the substrate, a contamination trap that is provided with at least one plate member for capturing contamination particles present in the projection beam of radiation and being directed to the contamination trap, and a particle supply unit to provide particles into the projection beam of radiation. The particle supply unit is arranged to supply particles into the projection beam of radiation in a space upstream from the contamination trap, relative to a direction of propagation of the projection beam of radiation, such that the particles collide with contamination particles directed to the contamination trap in order to provide the contamination particles with a velocity component in a direction perpendicular to the at least one plate member.

In an embodiment, a lithographic projection apparatus is provided. The apparatus includes a radiation system for providing a beam of radiation, and a support for supporting a patterning device. The patterning device serves to pattern the beam of radiation according to a desired pattern. The apparatus also includes a substrate table for holding a substrate, a projection system for projecting the patterned beam of radiation onto a target portion of the substrate, a contamination trap comprising a plate member for capturing contamination particles present in the beam of radiation, and a particle supply unit for providing particles into the beam of radiation in a space upstream from the contamination trap, relative to a direction of propagation of the beam of radiation, such that the particles collide with contamination particles directed to the contamination trap in order to provide the contamination particles with a velocity component in a direction perpendicular to the plate member.

The plate members of the contamination trap are arranged parallel to a direction of propagation of the projection beam of radiation in order to block as little radiation as possible. By collisions occurring within the contamination trap between the contamination particles and, optionally, other particles present within the contamination trap, many of the contamination particles will obtain a more or less random direction within the contamination trap, with the result of them being captured by one of the plate members. By providing additional particles into the projection beam of radiation in the space upstream from the contamination trap that collide with the contamination particles, it is possible to provide the contamination particles with an additional velocity component in a direction perpendicular to at least one of the plate members within the contamination trap. The chance that contamination particles are captured by one of the plate members may, thereby, be enhanced. Moreover, this may be done while providing the particle with a lower pressure than has been described in WO-A-03/034153. Thus, the undesired absorption of EUV is reduced while effectively capturing contamination particles with the contamination trap.

According to an embodiment of the invention, there is provided a device manufacturing method that includes providing a substrate that is at least partially covered by a layer of radiation-sensitive material, providing a projection beam of radiation using a radiation system, using a patterning device to endow the projection beam with a pattern in its cross-section, projecting the patterned beam of radiation onto a target portion of the layer of radiation-sensitive material, and supplying getter particles into the projection beam of radiation in order to act as a getter for contamination particles in the projection beam, the getter particles having a diameter of at least 1 nm.

According to an embodiment, a device manufacturing method is provided. The method includes generating a beam of radiation, patterning the beam of radiation, projecting the patterned beam of radiation onto a target portion of a substrate, and supplying getter particles into the beam of radiation in order to act as a getter for contamination particles in the beam of radiation. The getter particles have a diameter of at least 1 nm.

In an embodiment, a device manufacturing method is provided. The method includes capturing contamination particles present in a beam of radiation with a contamination trap comprising a plate member, patterning the beam of radiation, projecting the patterned beam of radiation onto a target portion of a substrate, and supplying particles into the beam of radiation in a space upstream from the contamination trap, relative to a direction of propagation of the beam of radiation, such that the particles collide with contamination particles directed to the contamination trap in order to provide the contamination particles with a velocity component in a direction perpendicular to the plate member.

According to an embodiment of the invention, there is provided a device manufacturing method that includes providing a substrate that is at least partially covered by a layer of radiation-sensitive material, providing a projection beam of radiation using a radiation system, capturing contamination particles present in the projection beam of radiation and being directed to a contamination trap provided with at least one plate member, providing particles into the projection beam of radiation with a particle supply unit, using a patterning device to endow the projection beam with a pattern in its cross-section, projecting the patterned beam of radiation onto a target portion of the layer of radiation-sensitive material, and supplying particles into the projection beam of radiation in a space upstream from the contamination trap, relative to a direction of propagation of the projection beam of radiation, such that the particles collide with contamination particles directed to the contamination trap in order to provide the contamination particles with a velocity component in a direction perpendicular to the at least one plate member.

The invention also relates to a device manufactured by a lithographic projection apparatus as defined herein.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
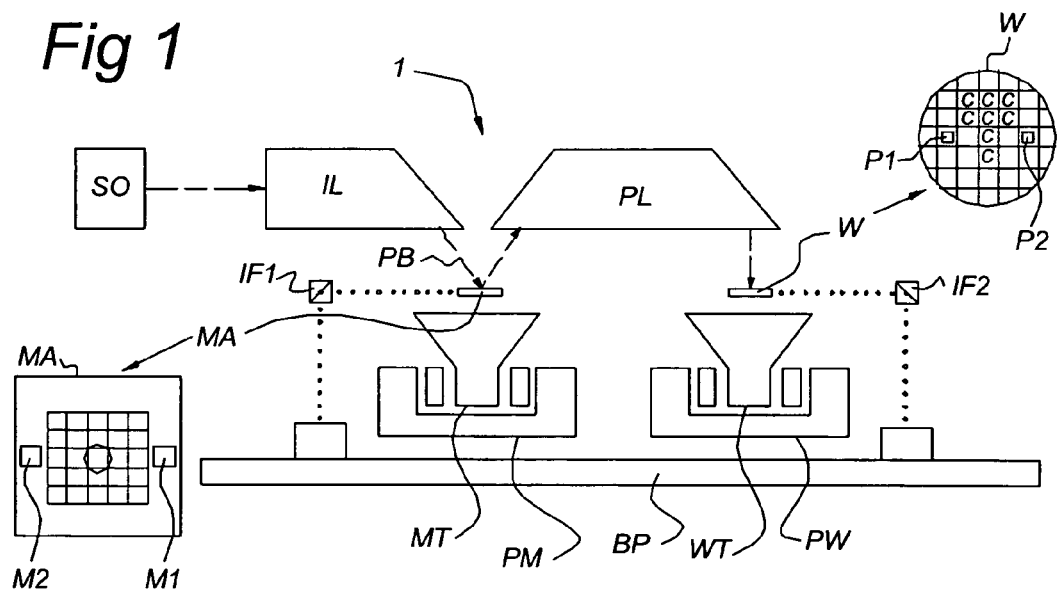
FIG. 1 depicts a lithographic projection apparatus according to an embodiment of the invention.

FIG. 1 schematically depicts a lithographic apparatus according to a particular embodiment of the invention. The apparatus includes: an illumination system (illuminator) IL for providing a projection beam PB of radiation (e.g. UV or EUV radiation); a first support structure (e.g. a mask table) MT for supporting a patterning device (e.g. a mask) MA and connected to a first positioner PM for accurately positioning the patterning device with respect to item PL; a substrate table (e.g. a wafer table) WT for holding a substrate (e.g. a resist-coated wafer) W and connected to a second positioner PW for accurately positioning the substrate with respect to item PL; and a projection system (e.g. a reflective projection lens) PL for imaging a pattern imparted to the projection beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus and the radiation beam is generally passed from the source SO to the illuminator IL with the aid of a radiation collector including, for example, suitable collecting mirrors and/or a spectral purity filter. In other cases the source may be integral part of the apparatus, for example, when the source is a mercury lamp. The source SO and the illuminator IL, may be referred to as a radiation system.

The illuminator IL may include an adjuster for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioner PW and position sensor IF2 (e.g. an interferometric device), the substrate table WT can be moved accurately, e.g. so as to position different target portions C in the path of the beam PB. Similarly, the first positioner PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following example modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
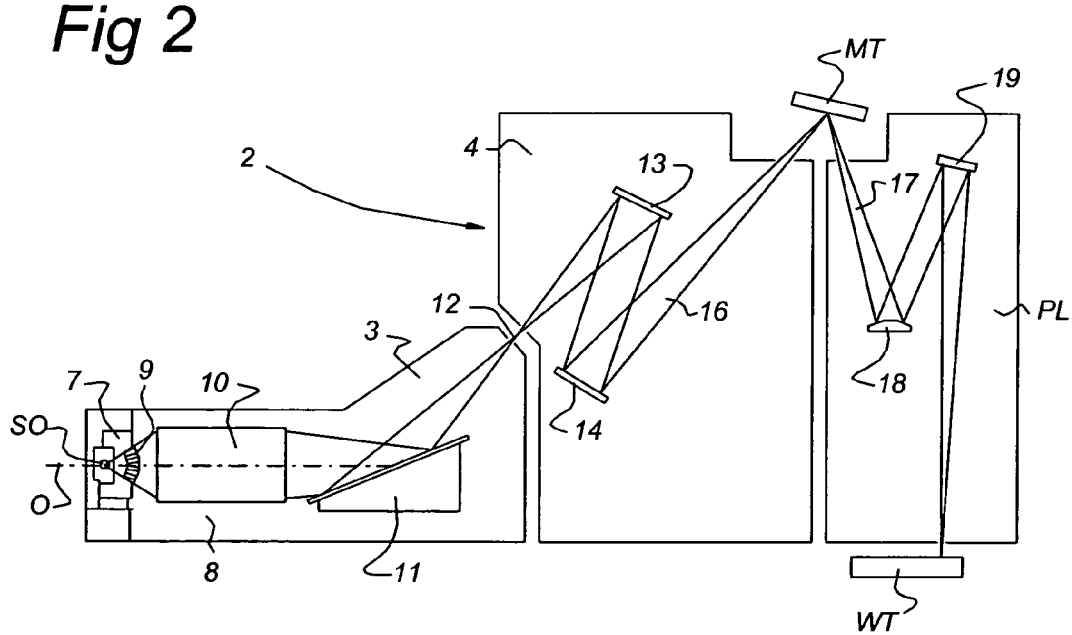
FIG. 2 shows some portions of the lithographic projection apparatus of FIG. 1 in more detail.

FIG. 2 shows the projection apparatus 1 in more detail, including a radiation system 2, an illumination optics unit 4, and the projection optics system PL. The radiation system 2 includes a source-collector module or radiation unit 3. Radiation unit 3 is provided with the radiation source SO, which may be formed by a discharge plasma. EUV radiation may produced by a gas or vapor, such as Xe gas or Li vapor in which a very hot plasma is created to emit radiation in the EUV range of the electromagnetic spectrum. The very hot plasma is created by causing a partially ionized plasma of an electrical discharge to collapse onto an optical axis O. Partial pressures of 10 Pa of Xe gas, Li vapor or any other suitable gas or vapor may be required for efficient generation of the radiation. The radiation emitted by radiation source SO is passed from a source chamber 7 into a collector chamber 8 via a gas barrier structure or contamination trap 9. The gas barrier structure 9 includes a channel structure such as, for example, described in detail in European patent applications EP-A-1 233 468 and EP-A-1 057 079, which are incorporated herein by reference.

The collector chamber 8 includes a radiation collector 10, which may be formed by a grazing incidence collector. Radiation passed by collector 10 is reflected off a grating spectral filter 11 to be focused in a virtual source point 12 at an aperture in the collector chamber 8. From collector chamber 8, projection beam 16 is reflected in illumination optics unit 4 via normal incidence reflectors 13, 14 onto a reticle or mask positioned on reticle or mask table MT. A patterned beam 17 is formed, which is imaged in projection optics system PL via reflective elements 18, 19 onto wafer stage or substrate table WT. More elements than shown may generally be present in illumination optics unit 4 and projection system PL.

Figure 3:
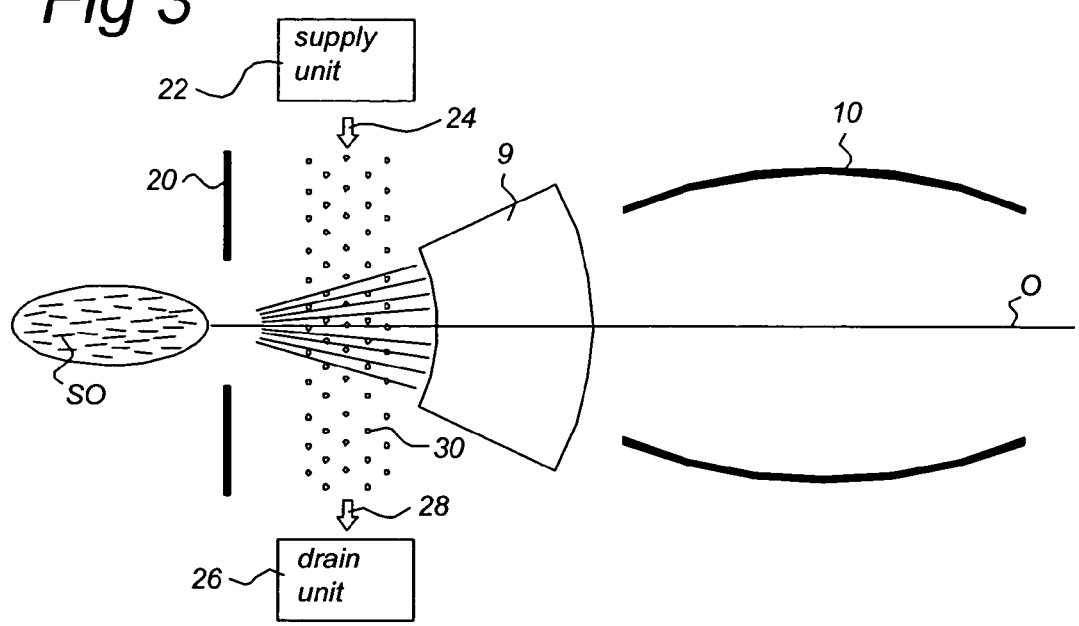
FIG. 3 shows an embodiment of the present invention designed to capture debris by means of nanoparticles.

In a first embodiment, the invention is related to an arrangement as shown in FIGS. 3 and 4.

EUV sources emit, apart from EUV photons, sputtered electrode material, gas, vapor, ions, and electrons. Recently, the use of metal vapor plasmas (for example, tin) as EUV-producing media, has been receiving much attention. However, the type of EUV source based on this principle produces a large amount of tin, which should be stopped before it enters the delicate optical system of the EUV lithographic projection apparatus. Since most materials strongly absorb EUV radiation, no sufficiently transparent window materials have been available. Thin foil filters still absorb approximately half of the incident power, resulting in thermal problems, such as evaporation and hole-burning. In an ideal case, when the filter is not destroyed, the filter will stop all the debris from the source.

A second option for debris suppression is a contamination trap, like trap 9. Such a contamination trap is provided with plate members that are positioned in the EUV beam, aligned along the path of the EUV radiation in order to block as little EUV radiation as possible. Such a contamination trap is reasonably resistant for EUV radiation and debris produced by EUV sources. However, there is a desire to further enhance the capture of debris to further enhance the lifetime of the first mirror in the EUV lithographic projection apparatus that is downstream from the contamination trap. This may be done by gettering by means of nanoparticles, as will be further explained with reference to FIGS. 3 and 4.

FIG. 3, in which like reference numerals refer to like components as in FIGS. 1 and 2, shows a wall 20 with an opening for passing EUV radiation towards the contamination trap 9. A supply unit 22 provides a flow 24 of getter particles into the projection beam upstream from the contamination trap 9. The getter particles are indicated with reference number 30. Here, they are defined as "nanoparticles" having a diameter in the order of about 1–1000 nm. This means that there are many particles with such a diameter. However, there may be particles with diameters outside this range. Moreover, these nanoparticles 30 may have a random shape. Reference to the term "diameter" does not mean that these nanoparticles need be spherically shaped.

A drain unit 26 drains the getter particles 30 from the lithographic projection apparatus, as is indicated with an arrow 28.

Although the arrangement shown in FIG. 3 includes the contamination trap 9, the present invention may be used without a contamination trap 9.

The nanoparticles 30 are used to block source-induced debris. Instead of using a thin foil in the EUV radiation that would be destroyed by the large heat load, a kind of "metacrystal" of nanoparticles 30 may be used. This may result in several new opportunities, such as using solid and/or liquid materials, using less transparent materials, because dimensions are smaller, being tolerant for changing of the material, because fast refreshment of particles is possible, etc. With respect to the contamination trap 9, more material surface may be used as a getter, since the getter particles are relatively transparent.

Sputtered electrode material and—depending on the nanoparticle material—water and hydrocarbons and other molecules/atoms/particles will stick to the nanoparticles 30, so that the nanoparticles 30 act as a getter. Moreover, since the nanoparticles 30 are quite heavy, as compared to the atomic ions of the contamination particles, they may be used to decelerate the fast ions produced by the source SO. Furthermore, when the nano-particles are electrically charged, they may deflect the fast ions produced by the source SO.

Preferably, the density of the nanoparticles 30 in the volume upstream of the contamination trap 9 is selected such that every contamination particle will encounter one nanoparticle 30, to which it will stick, and the EUV photons will encounter as few nanoparticles as possible. The EUV photons colliding with a nanoparticle will be partly absorbed by the nanoparticle 30. Therefore, it may be beneficial to use a relatively EUV-transparent material for the nanoparticles 30. The table below shows a non-exclusive range of materials that may be used as nanoparticles 30. The table shows the transmission of these materials for two different thicknesses of 10 and 100 nm. Note that the index of refraction of all materials listed in this table in the region of EUV is very close to unity. Therefore, scattering of the EUV radiation by these nanoparticles 30 is negligible. The transmission of the materials listed in the table is given for a theoretical sheet of 10 and 100 nm, respectively. The numbers given may, therefore, be regarded as a good first estimate for the transmission of 10 and 100 nm diameter particles, respectively.

TABLE I

| Material | 10 nm | 100 nm |
| --- | --- | --- |
| $Si_3N_4$ | 0.91692 | 0.42008 |
| Si | 0.98314 | 0.84366 |
| $SiO_2$ | 0.90459 | 0.36686 |
| $Al_2O_3$ | 0.69565 | 0.02654 |
| C | 0.93775 | 0.52585 |
| Mo | 0.94186 | 0.54935 |
| Sn | 0.50897 | 0.00117 |
| Ru | 0.84990 | 0.19665 |
| Zr | 0.96604 | 0.70785 |
| Fe | 0.61503 | 0.00774 |
| Au | 0.61774 | 0.00809 |
| Liquid $N_2$ | 0.95913 | 0.65886 |
| Liquid $CO_2$ | 0.95128 | 0.60686 |
| Liquid $H_2O$ | 0.93053 | 0.48676 |

TABLE I-continued

| Material | 10 nm | 100 nm |
|---|---|---|
| Sic | 0.95727 | 0.64619 |
| Xe | 0.702 | 0.029 |
| Ar | 0.971 | 0.747 |
| Kr | 0.84 | 0.19 |

The table shows that the transmission of the 10 nm getter particles is significantly higher than the transmission of the 100 nm getter particles. Therefore, it is beneficial to have small particles.

In order to calculate the density needed to stop the debris, let us assume a cylindrical volume with diameter D, length L, particle density n, and particles of diameter d. Looking parallel to the axis of such a cylinder, we assume to see one particle at every position (no particles behind another particle), i.e.:

$$\left[n\frac{\pi}{d}D^2L\right]\frac{\pi}{4}d^2 = \frac{\pi}{d}D^2 \qquad (1)$$

which can be rewritten into:

$$n = \frac{4}{\pi L d^2} \qquad (2)$$

For a stopping length L of 10 cm, and a particle diameter of 10 nm, the particle density n turns out to be in the order of $10^{17}$ m$^{-3}$. Another estimation of the required particle density can be found when the main free path $\lambda$ of debris in the volume without the particles is known. The particles travel a certain factor $\theta$ times the distance they have to overcome, i.e. the length L. During their journey along this path of length $\theta$.L, they have to encounter 1 nanoparticle, i.e., $$n = \frac{4}{\pi L d^2 \theta} \qquad (3)$$

which may be much smaller than (2), because $\theta$ is generally large. Note that the presence of a buffer gas enlarges $\theta$. Note that it may be beneficial to insert a buffer gas (preferably EUV transparent) in the nanoparticle volume. This will decrease the mean free path $\lambda$, and enlarge $\theta$, and thus decrease the required nanoparticle density.

The nanoparticles can be produced ex-situ, i.e. not in the vacuum vessel, or in-situ, i.e. in the vessel. Ex-situ produced particles may be sprayed into the system, in liquid or solid particles (see, for example, in T. J. McIntyre, and G. G. Via, J. Vac. Sci. Technol. B 7 (6), p 1927–1932, (1989)). The production in the vessel may be performed by a plasma, such as an rf discharge in argon and silane (see, for example, E. Stoffels, and W. W. Stoffels, thesis Eindhoven University of Technology, (1994), and A. Bouchoule, and L. Boufendi, Plasma Sources Sci, Technol. Vol. 2, p 204–213, (1993)), or by using a gas evaporation method (see, for example, Yu. I. Petrov, and A. E. Shafranovsky, Bull. Rus Acad. Sci Vol 64, No 8, p 1236–1244, (2000)), or by other methods. Gravity may be used for refreshing of particles, and plasmas may be used to confine the particles. Furthermore, it may be beneficial to use magnetic materials for the nanoparticles, in order to be able to control their direction and speed with a magnetic field.

Plasma-produced and -immersed particles are in general negatively charged. Furthermore, particles, which are irradiated with UV radiation, such as EUV, are in general positively charged. Having electrically charged particles offers another solution to manipulate their movement: applying an electric field.

Note that aerosols are used for rain generation, where they improve the condensation of water to droplets. This principle may also be used for the removal of metal vapor. Furthermore, the material acts as a getter, collecting hydrocarbons, and other materials.

Figure 4A:
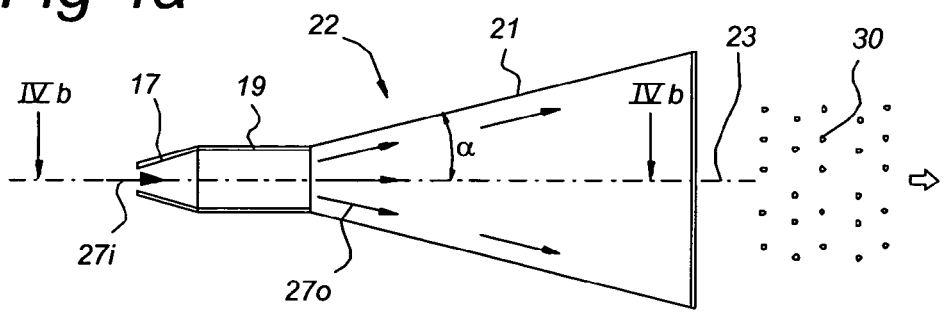
FIGS. 4a and 4b show a supply unit for supplying nanoparticles in the arrangement of FIG. 3.
Figure 4B:
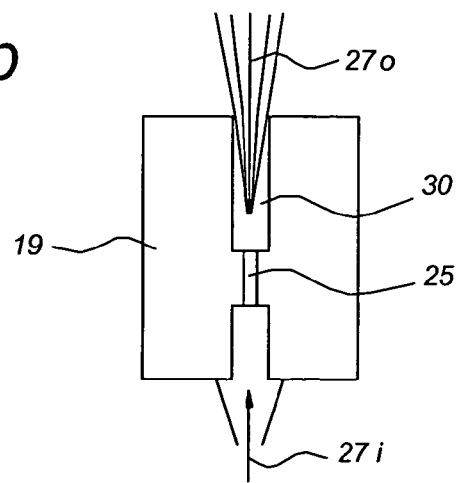

FIGS. 4a, 4b show one example of producing nanoparticles in detail, i.e., by a supersonic nozzle, that is known as such. The supersonic nozzle 22 includes an inlet 17 and an outlet 21. Between the inlet 17 and the outlet 21, there is provided an intermediate section 19. The outlet 21 may have a conical shape with an outer wall that intersects an axis of symmetry 23 under an angle $\alpha$. The angle $\alpha$ may be up to 10°.

FIG. 4b shows a cross section through intermediate section 19 along line IVb—IVb. Thus, FIG. 4b shows that intermediate section 19 includes an opening 30 that is provided with a very small through hole 25. The through hole 25 may have a diameter of, for example, about 10 μm.

At its inlet 17, the supersonic nozzle 22 receives an input gas flow 27i. Downstream from the small through hole 25, the input gas flow 27i is expanded. It produces an output gas flow 27o that is supersonic, i.e., the gas particles have a speed above the speed of sound. Due to the expansion, the temperature of the output gas flow falls dramatically. At the pressures involved, e.g., 1 to 10 Pa, the temperature may fall to 10 K or lower. Due to the extreme low temperature, a fog may be formed. Within that fog, several atoms of the gas may stick together to form nanoparticles of a diameter between about 1 and 10 nm.

As a gas, for example, Xe, $N_2$, Ar, may be used. These gases may form fog particles of several thousands of atoms sticking together. Other gases may be used instead.

In general, nanoparticles may be created by such a supersonic nozzle 22 when the temperature at the outlet of the nozzle 22 is lower than the temperature of solidification of the gas concerned.

The embodiment as described above is related to source-induced debris. It is also possible to use the nanoparticles in other parts of the lithography tool, e.g., in the projection system PL. Fast refreshment of the particles ensures that materials that stick to the particles may be removed quickly. The particles may be reused. However, for reuse, additional "cleaning" of the particles might be necessary.

Figure 5A:
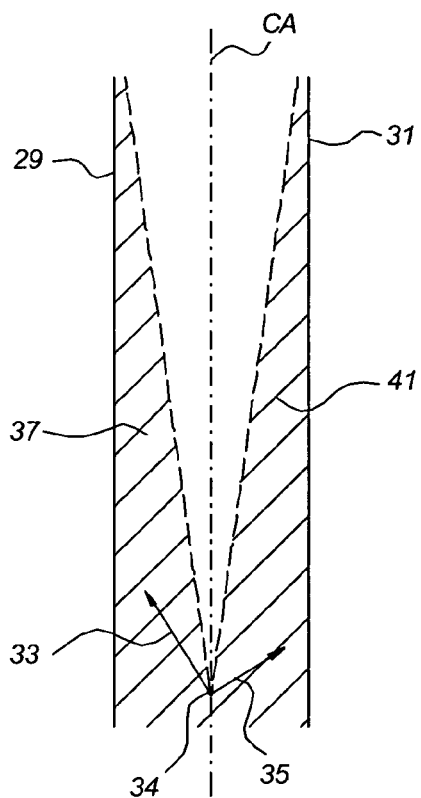
FIGS. 5a and 5b schematically show directions of propagation of a contamination particle to illustrate the problems solved by the present invention.
Figure 5B:
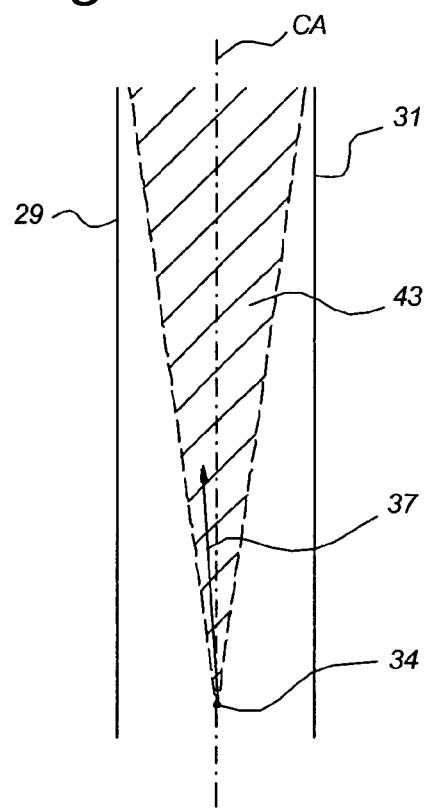

FIGS. 5a and 5b are intended to introduce further embodiments according to the FIGS. 6–8b.

In general, plate members of a contamination trap are aligned towards a certain focus or focus-line. At low pressure, particles originating from this focus and traveling along the optical axis O, at a straight line from the radiation source SO, will travel through the contamination trap 9 without being stopped.

FIG. 5a shows side views of two plate members 29, 31 in a schematic form. As an example, it also shows a contamination particle at position 34. Arrows 33, 35 show two possible directions of propagation of the contamination particle. These directions 33, 35 may deviate from the straight line CA from the radiation source SO due to collisions between the contamination particle and other particles. FIG. 5a shows two shaded areas 37, 41. When the direction of the contamination particle is in one of the shaded areas 37, 41, the contamination particle will eventually hit one of the plate members 29, 31.

FIG. 5b shows that the contamination particle has another direction of propagation indicated with arrow 37. The direction of arrow 37 varies per contamination particle. As long as the direction of propagation 37 is within the shaded area 43, indicated in FIG. 5b, the contamination particle concerned will not hit any of the plate members 29, 31, and will pass through the contamination trap, which should be prevented.

The general idea of the embodiments, shown in FIGS. 6–8b, is to slightly change the direction of propagation of the contamination particles, such that they are directed towards the plate members 29, 31 of the contamination trap. One way of doing this is to have a directed gas flow, which adds a velocity component perpendicular to the plate members 29, 31 of the contamination trap to the velocity of the contamination particles as they move from the source of radiation SO. The contamination particles will travel towards the plate members 29, 31 of the contamination trap and will thus effectively be removed from the EUV radiation beam. Preferably, the direction of propagation of the contamination particles is changed such that the contamination particles will never reach the end of the contamination trap. The redirecting of the direction of propagation of the contamination particles is performed upstream from the contamination trap.

Some examples will be illustrated with reference to FIGS. 6–8b.

Figure 6:
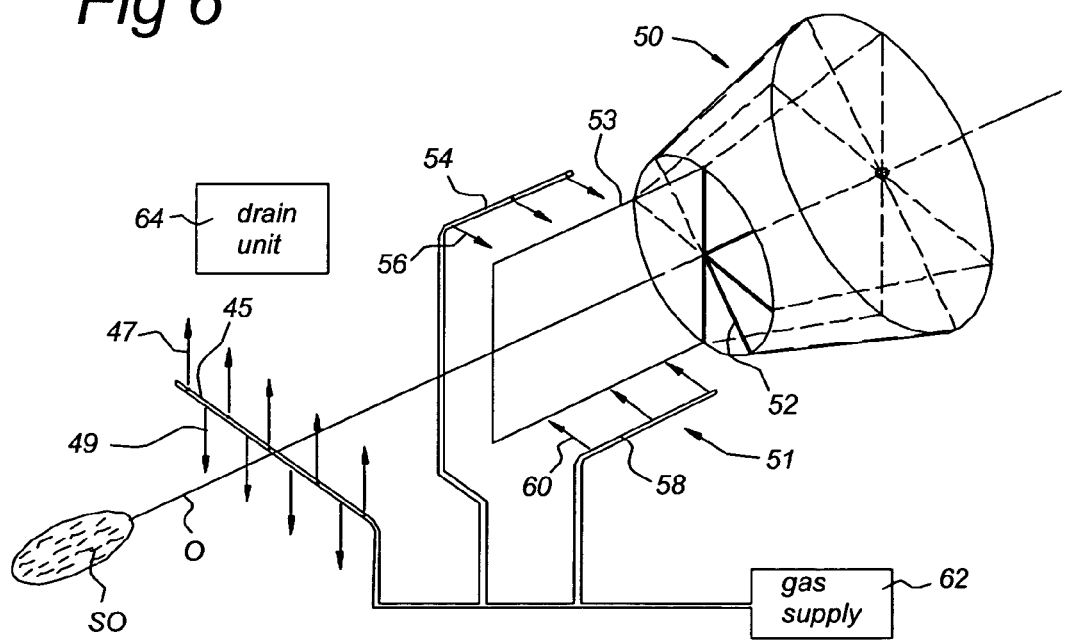
FIG. 6 shows a first embodiment of an arrangement according to the invention in which contamination particles are redirected by means of a particle flow.

FIG. 6 shows a first embodiment. In FIG. 6, like reference numbers as in the other figures refer to the same components.

FIG. 6 shows that the lithographic projection apparatus is provided with a gas supply 62. The gas supply 62 is connected to a line 45 that is provided with a plurality of holes. The gas supply 62 is also connected to two other lines 54, 58. The lines 54, 58 are also provided with holes. The figure also shows a contamination trap 50 provided with a plurality of plate members 52. The plate members 52 are radially oriented, i.e., they share a common line of intersection that coincides with the optical axis O. Thus, EUV radiation generated by the source SO may freely propagate through the space in between adjacent plate members 52, whereas contamination particles may be captured by the plate members 52, since they may obtain a more random direction due to collisions within the contamination trap 50.

The holes in the line 45 are oriented such that two gas flows 47, 49 in opposite directions are generated. The gas particles in these gas flows 47, 49 will collide with the contamination particles present within the beam of radiation, and provide the contamination particles with a velocity component in a direction such that the contamination particles will have a higher chance of having a velocity direction indicated with arrows 33, 35 upon entering the contamination trap 50. Thus, there is a higher chance of being captured by one of the plate members 52. The gas flows 47, 49 may be drained by a drain unit 64.

In the arrangement as shown in FIG. 6, the gas flows 47 and 49 may provide the contamination particles with a velocity component such that those contamination particles that enter the contamination trap 50 in the upper or lower part will not or will hardly impact on one of the plate members 52, since the additional velocity component is substantially parallel to the vertical plate members.

Therefore, in an embodiment, the arrangement according to FIG. 6 is provided with the lines 54, 58 referred to above, and with an additional vertical plate member 53 external to the contamination trap 50. At both sides of this additional plate member 53, the lines 54 and 58 produce respective gas flows 56, 60 in a direction perpendicular to the additional plate member 53. These gas flows 56, 60 provide contamination particles present in the area between the lines 54, 58, and the additional plate member 53, with an additional velocity component such that they have a high chance of hitting the additional plate member 53. This additional plate member 53 may then scatter the gas particles impacting upon its surface as if it is a kind of "cosine radiator". This scattered gas particles can act as a redirecting gas flow.

Like the gas flows 47, 49, the gas flows 56, 60 are drained by a drain unit 64. Of course, instead of one drain unit 64, several drain units may be used. Likewise, several gas supplies, instead of one gas supply 62, may be used.

It is observed that the additional plate member 53 may be used without the lines 54 and 58. Even then, some gas particles may hit the additional plate member 53 and be scattered as if it were a "cosine radiator".

Likewise, it is not necessary to use the vertical plate member 53 when the lines 54 and 58 are used. The lines 54 and 58 may provide the contamination particles that will eventually enter lower and upper ducts of the contamination trap 50 with an additional velocity component so that they will hit one of the plate members 52.

Likewise, the gas flows 47, 49 may also be used without the vertical plate member 53 and without the gas flows 56, 60.

Figure 7A:
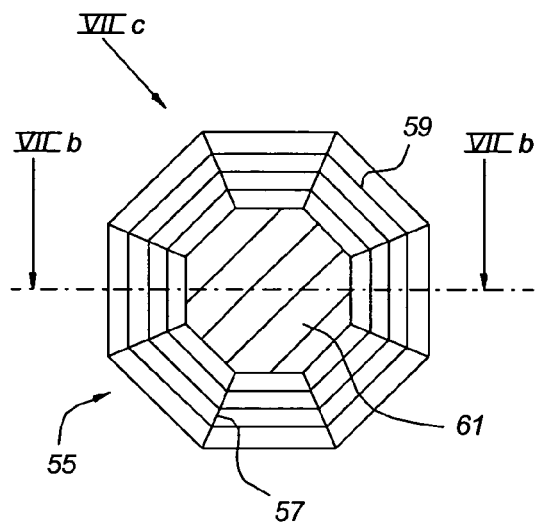
FIGS. 7a, 7b, and 7c show a contamination trap that can be used in the arrangement of FIG. 6, instead of the contamination trap shown there.
Figure 7B:
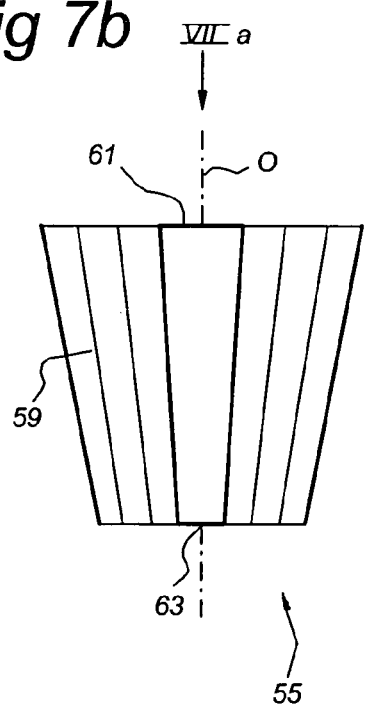
Figure 7C:
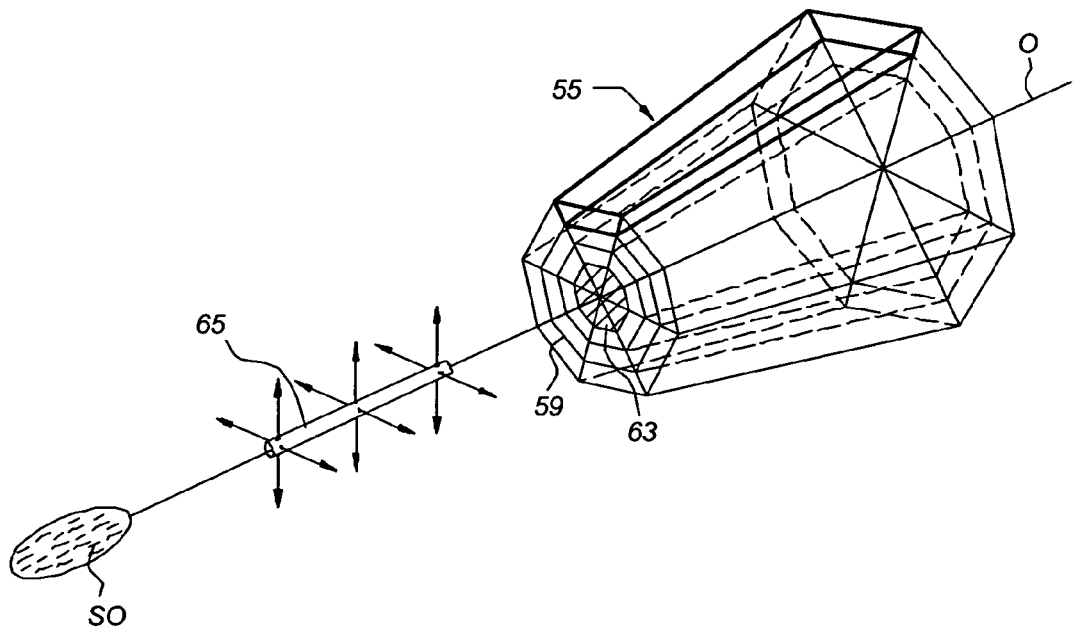

For other contamination traps, the implementation of a contamination particle redirector may be easier. FIGS. 7a–7c show different views of an alternative contamination trap 55.

The contamination trap 55 is provided with a plurality of sets of plate members 59. The sets are arranged as a polygon. The plate members 59 within one set are arranged so that they have a line of intersection that intersects the source of radiation SO and is perpendicular to the optical axis O. The plate members 59 of adjacent sets are supported by intermediate walls 57.

FIG. 7a shows a rear view of the contamination trap 55, i.e., viewed into the direction of the source of radiation SO along the optical axis O. In its center, the contamination trap is provided with a shield 61.

FIG. 7b shows a cross section through the device shown in FIG. 7a along the line VIIb—VIIb, the rear side of the contamination trap 55 being shown at the upper side. At its front side, located in its center, the contamination trap 55 is provided with a shield 63. The shields 61, 63 are connected by means of a material that has a good heat conductivity, so that heat produced by captured contamination particles may be drained more easily.

FIG. 7c shows a perspective view of the contamination trap 55. As shown, a line 65 that is provided with suitable holes to supply gas in radial directions from the optical axis O is provided upstream from the contamination trap 55. Thus, the gas flow produced by the line 65 redirects the contamination particles originating from the source of radiation SO to provide them with a velocity component such that upon entering the trap 55, they have a very high chance of colliding with one of the plate members 59. As may be evident from FIG. 7c, a radial gas flow is relatively easy to produce.

Figure 8A:
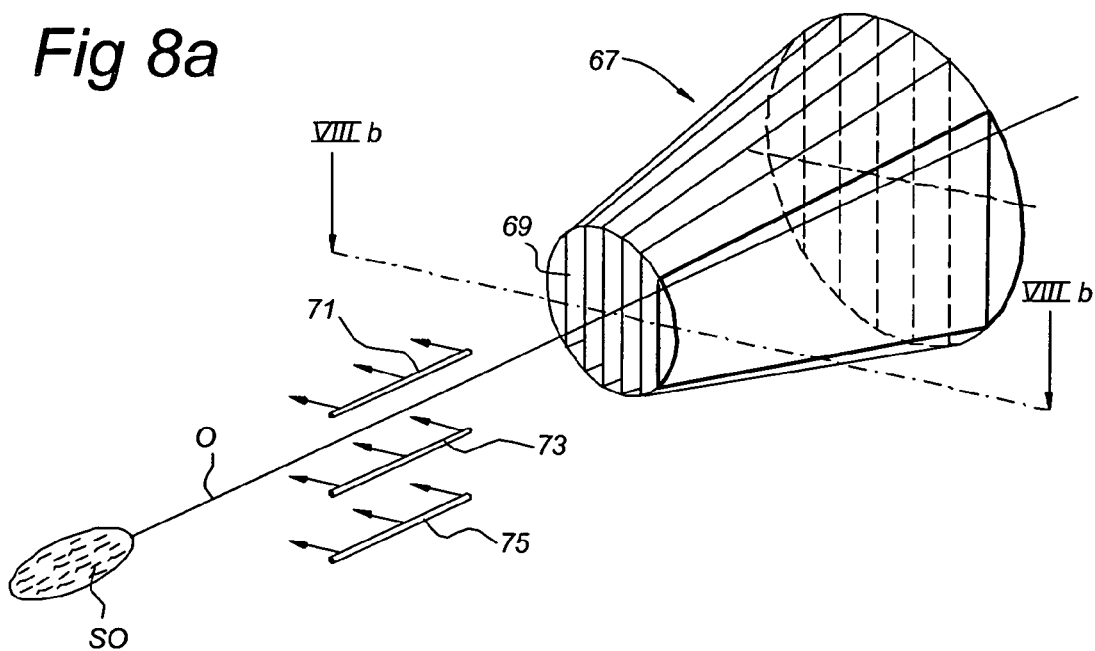
FIGS. 8a and 8b show different views of a further alternative contamination trap that can be used in an arrangement in which contamination particles are redirected by means of a flow of other particles.
Figure 8B:
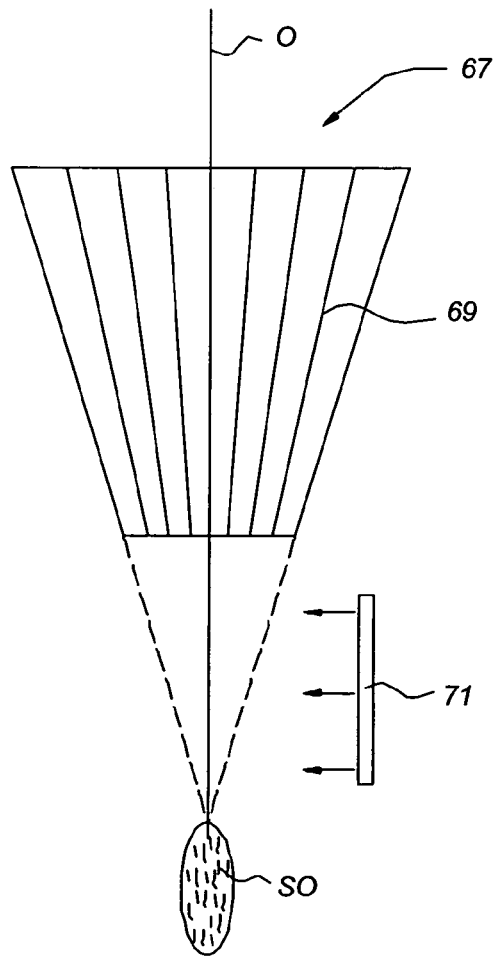

FIGS. 8a and 8b show a further embodiment of a contamination trap 67 that may be used in the present invention.

The contamination trap 67 of FIG. 8a includes a set of plate members 69 that have a common line of intersection that intersects the source of radiation SO. In this respect, the plate members 69 may be seen as one of the sets of the arrangement according to FIGS. 7a–7c, be it that this single set then entirely fills a volume of the contamination trap 67.

Contamination particles originating from the source of radiation SO may easily be redirected to have a high chance of hitting one of the plate members 69 upon entering the contamination trap 67. One arrangement is shown in FIG. 8a and includes a plurality of lines 71, 73, 75 that are provided with suitable holes to provide a unidirectional gas flow. The unidirectional gas flow is directed such that the contamination particles, after collisions with the gas flow produced by the lines 71, 73, 75, are provided with an additional velocity component such that they are directed towards one of the plate members 69.

FIG. 8b shows a top view of the arrangement according to FIG. 8a with a cross section through the contamination trap 67.

While specific embodiments of the invention have been described above, it will be appreciated that the invention may be practiced otherwise than as described. The description is not intended to limit the invention.

For example, as will be evident to persons skilled in the art, other contamination trap designs are possible too. The plate members shown in the embodiments here have flat surfaces. However, the invention is not restricted to contamination traps with flat plate members. The plate members may be curved.

Moreover, FIGS. 7a–7c show a polygon with eight segments. Of course, other numbers of segments may be used.

Although the present invention is shown to produce directed gas flows with lines provided with suitable holes, directed gas flows may be produced in any way known to persons skilled in the art.

Moreover, as will be evident to persons skilled in the art, the figures are schematic in the sense that they do not show every detail. For example, the gas supply 62 and the gas drain unit 64 in FIG. 6 may be connected to a suitable control unit, like a computer. Moreover, the lines 65, 71, 73, 75, as shown in FIGS. 7c, 8a and 8b, are also connected to a gas supply 62 that may be controlled by a suitable control unit, like a computer. Also, in the embodiments according to FIGS. 7a–7c, 8a–8b, a suitable gas drain unit 64 to drain the gas from the space upstream from the contamination trap will be provided.

One of the advantages of the invention described above is that the gas load to the photolithographic apparatus may be lower than for a classical contamination trap, while the contamination particle suppression is improved. Moreover, the combination of a redirecting flow and a contamination trap is beneficial, as compared to the redirecting flow only, because a relatively low gas pressure may be sufficient. The contamination particles need only be redirected to a small extent to have a very high chance of being captured by one of the plate members within the contamination trap. Examples of the gas pressure and gas flow velocities are: for low pressures between 0.1–1 Pa ($10^{-3}$–$10^{-2}$ mbar), the gas flow velocity may be 1– 100 sccm, whereas for higher pressures in the order of 10 Pa ($10^{-1}$ mbar), the gas flow velocity may be 100–1000 sccm.

It is observed that the embodiments shown in FIGS. 3, 4a, 4b may also be used as a re-director of contamination particles, since the nanoparticles 30 may also provide the contamination particles with a suitable velocity component so that they will have a higher chance of collision with one of the plate members of the contamination trap 9.

The description given above is mainly valid for a low-pressure regime, i.e., where contamination particles have a large mean free path. However, it is possible to use a directional flow at higher pressures, e.g., 10 Pa (0.1 mbar). Then, the directional flow may redirect clusters of debris (larger contamination particles). Larger, heavy particles that are not redirected substantially by a single collision may still be redirected by a directed gas flow at higher pressure, due to the fact that a lot of these redirecting collisions occur and that the effect of these many collisions add up.

What is claimed is:

1. A lithographic projection apparatus comprising:
   a radiation system for providing a beam of radiation;
   a support for supporting a patterning device, the patterning device serving to pattern the beam of radiation according to a desired pattern;
   a substrate table for holding a substrate;
   a projection system for projecting the patterned beam of radiation onto a target portion of the substrate; and
   a particle supply unit for supplying getter particles into said beam of radiation in order to act as a getter for contamination particles in said beam of radiation, said getter particles having a diameter of at least about 1 nm.

2. A lithographic projection apparatus according to claim 1, wherein the particle supply unit forms part of said radiation system.

3. A lithographic projection apparatus according to claim 1, further comprising an illumination optics unit, wherein said radiation system comprises a radiation source, and said particle supply unit is positioned between said source and said illumination optics unit.

4. A lithographic projection apparatus according to claim 1, wherein the particle supply unit is arranged to supply the getter particles as freely moving getter particles.

5. A lithographic projection apparatus according to claim 1, wherein the getter particles have a diameter of less than about 1000 nm.

6. A lithographic projection apparatus according to claim 1, wherein said radiation system has a radiation source producing EUV radiation.

7. A lithographic projection apparatus according to claim 6, wherein the EUV radiation has a wavelength of approximately 13.5 nm.

8. A lithographic projection apparatus according to claim 1, wherein said getter particles are selected from a group consisting of: $Si_3N_4$, Si, $SiO_2$, $Al_2O_3$, C, Mo, Sn, Ru, Zr, Fe, Au, liquid $N_2$, liquid $CO_2$, liquid $H_2O$, SiC, Xe, Ar, and Kr.

9. A lithographic projection apparatus according to claim 1, wherein the particle supply unit comprises a supersonic nozzle.

10. A lithographic projection apparatus according to claim 9, wherein said supersonic nozzle has an outlet for supplying said getter particles into said lithographic apparatus with a pressure between about 1 and about 10 Pa.

11. A lithographic projection apparatus according to claim 1, wherein the lithographic projection apparatus is also provided with a contamination trap, said particle supply unit being arranged to supply said getter particles in a space upstream from said contamination trap, relative to a direction of propagation of said beam of radiation.

12. A device manufactured by a lithographic projection apparatus according to claim 1.

13. A lithographic projection apparatus comprising:
   a radiation system for providing a beam of radiation;

a support for supporting a patterning device, the patterning device serving to pattern the beam of radiation according to a desired pattern;

a substrate table for holding a substrate;

a projection system for projecting the patterned beam of radiation onto a target portion of the substrate;

a contamination trap comprising a plate member for capturing contamination particles present in said beam of radiation; and a particle supply unit for providing particles into said beam of radiation in a space upstream from said contamination trap, relative to a direction of propagation of said beam of radiation, such that said particles collide with contamination particles directed to said contamination trap in order to provide said contamination particles with a velocity component in a direction perpendicular to said plate member.

14. A lithographic projection apparatus according to claim 13, wherein the particle supply unit forms part of said radiation system.

15. A lithographic projection apparatus according to claim 13, further comprising an illumination optics unit, wherein said radiation system comprises a radiation source, and said particle supply unit is positioned between said source and said illumination optics unit.

16. A lithographic projection apparatus according to claim 13, wherein said lithographic projection apparatus further comprises a supply line provided with holes and connected to a gas supply unit.

17. A lithographic projection apparatus according to claim 13, wherein said particle supply unit is arranged to supply particles into said beam of radiation with a diameter between about 1–1000 nm.

18. A lithographic projection apparatus according to claim 13, wherein said radiation system has a radiation source producing EUV radiation.

19. A lithographic projection apparatus according to claim 18, wherein the EUV radiation has a wavelength of approximately 13.5 nm.

20. A lithographic projection apparatus according to claim 13, wherein said contamination trap comprises a set of plate members, each plate member being arranged in a separate plane, and all separate planes having one common axis of intersection, said axis of intersection coinciding with an optical axis intersecting the radiation source.

21. A lithographic projection apparatus according to claim 13, wherein said contamination trap comprises a set of plate members, each plate member being arranged in a separate plane, and all separate planes of one set having one common axis of intersection, said axis of intersection intersecting the radiation source, and being perpendicular to an optical axis intersecting said radiation source.

22. A lithographic projection apparatus according to claim 21, wherein said contamination trap comprises a plurality of sets of plate members, the sets being arranged in a polygon order.

23. A device manufactured by a lithographic projection apparatus according to claim 13.

24. A device manufacturing method comprising:

generating a beam of radiation;

patterning the beam of radiation;

projecting the patterned beam of radiation onto a target portion of a substrate; and supplying getter particles into said beam of radiation in order to act as a getter for contamination particles in said beam of radiation, said getter particles having a diameter of at least 1 nm.

25. A device manufacturing method comprising:

capturing contamination particles present in a beam of radiation with a contamination trap comprising a plate member;

patterning the beam of radiation;

projecting the patterned beam of radiation onto a target portion of a substrate; and supplying particles into said beam of radiation in a space upstream from said contamination trap, relative to a direction of propagation of said beam of radiation, such that said particles collide with contamination particles directed to said contamination trap in order to provide said contamination particles with a velocity component in a direction perpendicular to said plate member.

26. A device manufacturing method according to claim 25, where the contamination trap comprises a plurality of plate members.

* * * * *